United States Patent [19]

Hocker et al.

[11] Patent Number: 4,740,412

[45] Date of Patent: Apr. 26, 1988

[54] MULTI-LAYERED SHEET STRUCTURES

[75] Inventors: Jürgen Hocker, Bergisch-Gladbach, Fed. Rep. of Germany; Bruno Broich, Spreitenbach, Switzerland

[73] Assignee: Bayer Aktiengesellschaft, Leverkusen, Fed. Rep. of Germany

[21] Appl. No.: 456,556

[22] Filed: Jan. 10, 1983

[30] Foreign Application Priority Data

Jan. 20, 1982 [DE] Fed. Rep. of Germany ....... 3201482

[51] Int. Cl.$^4$ .................. C08F 38/02; C08F 138/02
[52] U.S. Cl. .................. 428/194; 428/517; 429/213; 525/328.1; 526/285
[58] Field of Search ............ 428/194, 922, 517, 521; 526/285; 525/328.1; 429/213

[56] References Cited

U.S. PATENT DOCUMENTS

| | | | |
|---|---|---|---|
| 2,430,459 | 11/1947 | Farrell et al. | 428/121 X |
| 3,119,799 | 1/1964 | Natta et al. | 526/159 |
| 3,457,156 | 7/1969 | Fisher | 526/285 X |
| 3,726,769 | 4/1973 | Borsenberger et al. | 427/124 X |
| 3,857,821 | 12/1974 | Becker et al. | 526/285 |
| 4,011,378 | 3/1977 | White | 525/328.1 |
| 4,137,550 | 1/1979 | Kaganowicz et al. | 428/65 X |
| 4,204,216 | 5/1980 | Heeger et al. | 252/500 X |
| 4,329,395 | 5/1982 | Pickford | 428/344 |
| 4,384,090 | 5/1983 | Hocker et al. | 526/169.2 |
| 4,394,402 | 7/1983 | Yasuta et al. | 427/40 |
| 4,397,971 | 8/1983 | Hocker et al. | 524/41 X |
| 4,419,277 | 12/1983 | Myers | 525/343 X |
| 4,439,590 | 3/1984 | Hanson | 526/285 |
| 4,444,970 | 4/1984 | Weddigen | 526/285 |
| 4,481,312 | 11/1984 | Hocker et al. | 526/285 X |
| 4,489,154 | 12/1984 | Taylor | 430/253 |
| 4,681,822 | 7/1987 | Berthier et al. | 429/213 X |
| 4,686,160 | 8/1987 | Yoshino et al. | 429/213 X |

FOREIGN PATENT DOCUMENTS 0082822 7/1981 Japan .................. 428/521

OTHER PUBLICATIONS

Chemical Abstracts, Band 98, 4 Apr., 1983, Seite 57, No. 108583e.

Japanese Patents Report, Woche R45, 12/18/70, Section A & E, Weite 1, Zusammenfassung No. 83739R.

*Primary Examiner*—Henry F. Epstein
*Attorney, Agent, or Firm*—Connolly & Hutz

[57] ABSTRACT

Multi-layered sheet structures comprising at least two layers, at least one of which consists of optionally doped polyacetylene, and at least one other layer joined thereto consists of a plastics material or inorganic material forming films or coatings, and processes for the production thereof.

16 Claims, No Drawings

MULTI-LAYERED SHEET STRUCTURES

This invention relates to laminates or sheet-like composites which contain one or more layers of optionally doped polyacetylene and to processes for the production thereof. The compound has a mechanically, chemically and electronically stabilizing effect on the polyacetylene layer and thus allows, for the first time, a straightforward use of polyacetylene for the most varied purposes. The design of the laminate structures depends on the use and, for example, they may be adapted such that they may be stressed particularly in mechanical terms, they protect the polyacetylene film against the harmful influence of atmospheric oxygen and, all told, they have a property spectrum which a polyacetylene film on its own does not have. Thus, by the juxtaposition between the polyacetylene film and other electronically active materials, for example metals, semiconductors or photoconductors, improved properties and additional electronic properties of the polyacetylene laminates are achieved which are extremely useful for many purposes or which even make these applications feasible for the first time.

It is generally known that polyacetylene is a conductive polymer which, electronically, behaves like a semiconductor or even a metal. In its native condition, the electrical conductivity of polyacetylene is from $10^{-9}$ to $10^{-5}$ s/cm, depending on the proportion of cis- or trans-isomers. In a similar manner to inorganic semiconductors by chemically doping with electron acceptors or donors, it is possible to increase the electrical conductivity of polyacetylene over many orders of magntidue up into the metallic range (see J. of Chem. Phys. 73, 946 (1980)).

Polyacetylene may be produced in the form of films by known processes or may be further processed into films starting from certain modified forms (for example burr-shaped or fibrous polyacetylene particles).

Due to the unusual electrical properties thereof, such films would in principle be suitable for a plurality of commercial uses. However, the high oxidation sensitivity of polyacetylene films militates against a broad application. They lose the high electrical conductivity and become brittle even after a short time under the influence of, for example, atmospheric oxygen.

It has been found that the flexibility and the electrical conductivity of a polyacetylene film is maintained in a virtually undiminished manner when the film is coated on both sides with an oxygen-impermeable film and is sealed at the edge. Various processes are available for coating a polyacetylene film on both sides with gas-impermeable cover films, depending on the film material. For example, it is possible to run the three films between two rollers and press them together under pressure, or to bond the cover films directly onto the polyacetylene film. In both cases, the projecting edges may either be sealed or bonded together. The compound element is most favourably produced under an inert gas atmosphere. The gas-impermeable cover films are an additional protection for the polyacetylene film which may only be stressed mechanically to a slight extent. The compound element having the conductive polyacetylene layer may be handled in a simple and straight-forward manner. Compressing the three films together usually causes a reduction in thickness of the polyacetylene film, under certain circumstances to as much as a third of the original thickness. Consequently, not only does the compound element become altogether thinner, but the specific conductivity of the polyacetylene film is increased. This is very desirable for many purposes, for example for the use of a laminate of this type as a large-area heating element. As an additional useful property, the electrically conductive polyacetylene film is electrically insulated by being encapsulated in cover films, so that it may be safely used as, for example a flat heating element. In order to achieve particularly effective properties with respect to gas or water vapour permeability, mechanical strength or electrical insulation, the cover films may for their part form compound films.

Basically all film materials are included for lamination with polyacetylene. Films or coatings of metal are particularly suitable, for example, Al, Cu, Sn, and Ni, polyolefins, such as polyethylene and polypropylene, halogenated polyethylenes, such as polyvinyl chloride, polyvinylidene chloride, polyvinylidene fluoride, polytetrafluoroethylene, polyvinyl acetate, polyvinyl alcohol, polyacetals, polystyrenes, polyesters, polycarbonates, polysulphones, polyurethanes, polyamides and cellulose derivatives, such as cellulose hydrate or cellulose acetate. The polymers may optionally also be present as copolymers.

For the present purposes, the geometrical shape and dimensions of the compound elements with polyacetylene are not subject to restrictions. Small- and large-area structures are both possible. Large-area, sheet-like structures are particularly preferred, in particular strips of any length and width.

The present invention provides flexible multi-layered sheet structures comprising at least two layers, at least one of which consists of optionally doped polyacetylene and at least one other layer joined thereto consists of a plastics material or inorganic material forming films or coatings. In particular, the present invention provides those sheet structures in which the layer of plastics or inorganic material is impermeable to oxygen. In one particular embodiment, a polyacetylene layer is sandwiched between oxygen-impermeable layers of plastics or inorganic material, the edges of the thus-formed laminate being sealed against the effect of oxygen. In another preferred embodiment, a polyacetylene layer is joined to a layer of an electrically conducting plastics or a metallic electrical conductor forming films or coatings, or an organic or inorganic electrical semiconductor or photoconductor, such that there is an intimate electrical contact. In another embodiment, the layer of plastics or inorganic material is provided on both sides with a polyacetylene layer.

For may purposes, it is necessary for the polyacetylene layer in the laminate or compound element to form the cover layer and thus for it to remain freely accessible.

In the context of the present invention, laminates or sheet-like compound elements consist in the simplest case of one polyacetylene component and a second component of any organic or inorganic material.

Due to the oxygen sensitivity of the polyacetylene layer which has already been mentioned, those laminates or compound elements are particularly preferred, in which at least one component is an oxygen-impermeable layer.

The advantage of the polyacetylene laminates compared to polyacetylene films is not only in their improved mechanical strength and in their inertness against oxidative gases, but also in new electronic properties which a polyacetylene film on its own does not have and which are only produced by the joining of the polyacetylene with other semiconducting or metallically conductive materials.

In the compound elements according to the present invention, the polyacetylene film forms with conductive organic or inorganic materials a flat electronic contact. The electrically semiconducting or conductive layer applied onto the polyacetylene may cover a surface which is structured in any manner and, for example may take the form of comb electrodes or printed conductors.

The following are included as examples of such materials: conductive polymers, metals, semiconductors, photoconductors or solid electrolytes.

The laminates or compound elements according to the present invention may be produced by the most varied processes:

In the simplest case, a sheet-like, doped or undoped polyacetylene structure which has been produced according to any process is covered with an organic or inorganic film material under pressure, optionally at an elevated temperature and optionally using an adhesive. According to this process, several film layers may also be applied to the polyacetylene on one or both sides. Moreover, it is possible by this process to cover any film material on both sides with optionally doped polyacetylene and to coat this compound film with other, optionally oxygen-impermeable film materials.

It is also possible to lacquer one or both sides of a sheet-like, optionally doped polyacetylene structure which has been produced according to any process, with a polymer or a polymer precursor and, after being applied, the polymer precursor polymerises into a continuous coating in a subsequent reaction.

A vacuum packing of polyacetylene films is also possible and results, in may cases, in an intimate contact between the film materials.

A polyacetylene layer or polyacetylene film which is metallized on one or both sides also represents a polyacetylene laminate or polyacetylene compound element in the context of the present invention. In this case, the metallization operation may take place according to different processes:

For example, the metal may be evaporated onto a sheet-like polyacetylene structure under vacuum. Furthermore, the metal layer may be applied by sputtering under high vacuum.

Furthermore, the metallization of sheet-like polyacetylene structures may be effected by electronic or current-less galvanisation. Thus, the metal layer may penetrate by as much as 20 $\mu$m into the polyacetylene layer and may thus produce a particularly intensive electrical contact.

The following are included as particularly suitable metals: Au, Pt, Ag, Cu, Ni and Co.

In principle, any metal is suitable for the compound structure with polyacetylene. The following are particularly preferred: Au, Pt, Ag, Ni, Co, Cu, Al, Fe, Se, B, W, Mo, Sn and Zn. The choice of the contact metal depends on requirements. For example, for a current-supplying or current-removing contact surface, the metal is selected such that a particularly low-resistance electrical contact of an ohmic character for the polyacetylene is produced. A polyacetylene/Au contact surface meets this requirement in a particularly effective manner. However, a polyacetylene/Al contact has a rectifying character.

The electrical join to the polyacetylene may also be produced by a conductive graphite layer. A polyacetylene graphite laminate is distinguished by a high corrosion resistance.

For applying semiconductor or photoconductor layers, processes may be used which are generally termed chemical or physical vapour deposition.

The processes for the production of the laminates or sheet-like compound elements are preferably carried out under an inert gas atmosphere, such as $N_2$ or Ar.

Accordingly, the present invention also provides laminates or compound elements, in which the layer next to the polyacetylene layer may be a polymer or a conductive polymer, a metal, a semiconductor, a photoconductor and/or a solid electrolyte film, the polyacetylene layer forming an intensive electronic contact with the adjacent conductive boundary surface.

Within the context of the present invention, there is no restriction regarding how the polyacetylene component is produced in the compound element or in the laminate. On principles, three different methods may be distinguished:

1. The starting point for the production of the laminate is a flat polyacetylene film which is joined to other polymer films and/or metal films, or is coated with other materials according to known processes and to processes described above.
2. The laminate is produced by directly polymerising acetylene gas onto a suitable substrate surface.
3. The surface of a mono- or multi-component substrate is directly coated with polyacetylene.

The last-mentioned procedure is preferred for the laminate production, according to which the polyacetylene layer is directly applied to a flat substrate. A stable suspension if burr-shaped or fibrous, optionally doped polyacetylene particles of a diameter of from 0.01 to 1 mm and having a plurality of fibrous extensions ("burrs") is particularly suitable for coating a substrate with polyacetylene, which suspension is obtained by introducing acetylene into an organic suspending agent with continuous mixing in the presence of an organometallic mixed catalyst in a quantity corresponding to from 10 to 100 mmol of aluminium and from 5 to 50 mmol of titanium tetrabutyrate or from 1 to 10 mmol of bis-(2,2-dimethyl-propoxy)-vanadium oxychloride per liter of suspending agent, until about 3 g of polyacetylene have formed per liter of suspending agent.

The suspension which has been described may be further processed and used in different ways, optionally after removing the catalyst and/or exchanging the solvent. It may be sprayed very effectively onto any substrate surface and, after the solvent has evaporated, there remains on the substrate a homogeneous, firmly adhering, optionally doped polyacetylene layer.

The good join between the polyacetylene layer and the substrate is the determining criterion. Due to the oxygen sensitivity of polyacetylene, the latter is preferably applied to the substrate surface under an inert gas atmosphere. Spray guns with a gas pressure propulsion, for example, are suitable for spraying. Spray guns with an electric drive ("airless") are particularly well suited for a controlled flat coating, because the thickness of the polyacetylene layer may be exactly controlled and may be varied upwards from about 0.1 $\mu$m.

A vacuum spray process has proved to be particularly advantageous for the laminate production. In this process, the substrate to be coated is positioned in a low pressure chamber, into which the polyacetylene suspension is sprayed using a modified spray gun which is flange-mounted from outside the chamber wall. This process guarantees a particularly homogeneous polyacetylene coating when care is taken that the solvent evaporating from the substrate surface and which is pumped off again is balanced with the freshly supplied quantity of solvent. The growth rate of the polyacetylene layer may be controlled in a particularly effective manner by regulating the quantity of polyacetylene suspension which is sprayed. The laminate or the substrate is slowly passed by the spraying field at a suitable speed. These processes which may also be carried out continuously, guarantee a homogeneous mass covering of the substrate with polyacetylene. Moreover, the low pressure chamber guarantees moisture-free and oxygen-free surroundings.

Apart from spraying or sprinkling, the polyacetylene suspension may also be applied by casting, rolling, doctoring or brushing. Film casting machines and installations are suitable for the continuous production of polyacetylene laminates. In this apparatus, the suspension is continuously applied at one point to a substrate film running on rollers. The substrate film guides the polyacetylene mass, while brushing smooth or rolling, through a heating furnace with suction removal of the solvent vapour.

The coating techniques which have been described permit a homogeneous distribution of the polyacetylene mass over the substrate surface. It is easily possible to meter or adjust the layer thickness by regulating the quantity applied.

The laminates according to the present invention may be used as electrically conducting or as semiconducting construction elements, for example in flat heating conductors, in electronic devices, as battery elements, for capacitors, or for photo-voltaic transducers.

Polyacetylene laminates are also suitable as selective absorber surfaces in photo-thermal transducers.

A conventional compressed gas- or electrically-operated lacquer spray gun is filled with a suspension of polyacetylene particles, and this is sprayed onto different substrates. When the solvent evaporates, a homogeneous PAC film remains firmly adhering to the surface. Due to the oxidation sensitivity of PAC, inert compressed gases, such as nitrogen or noble gases, are used. Particularly homogeneous, firmly adhering films are obtained by using a low pressure chamber. The chamber not only ensures oxygen-free surroundings, but simultaneously allows a controlled suction removal of the solvent evaporating from the surface. A dynamic equilibrium is preferably produced between the quantity of solvent sprayed on and the quantity which is removed by suction. The low pressure chamber used for the process is made of high-grade steel and comprises inspection windows and a suction flange and spray guns which may be operated from outside and are integrated into the chamber.

The substrate film to be coated is passed by the spray head at a suitable spacing in the chamber. The mass coating with PAC is simultaneously controlled by suitable measuring methods (for example a quartz resonator).

Laminates having polyacetylene layers of different thicknesses were produced. The PAC layers adapted in a flexible manner to the properties of the respective substrate film. The polyacetylene layer was combined with different substrate layers, for example metals, polymers, semiconductors (for example, selenium, ZnO, indium-tin oxide, Si and GaAs), glass and ceramics (for example $SiO_2$ and $Al_2O_3$) in the laminates or compound elements. A very good join between the polyacetylene and the substrate was produced in every case.

PRACTICAL EXAMPLES

Example 1

Production of a spray suspension 1.3 liters of toluene are introduced into a 2 liter stirrer-equipped beaker apparatus, and 300 ml of toluene are distilled off under a stream of nitrogen. 4 ml (2 mmol) of bis-(2, 2,-dimethyl-propoxy)-vanadium-oxychloride, 0.5 molar in toluene, and 20 ml (20 mmol) of aluminium triisobutyl, 1 molar in toluene, are added with dry ice cooling at $-78°$ C. During this operation, the apparatus stands under a continuous stream of nitrogen. Pure acetylene is passed through for 1 hour and with stirring at a rate of 10 liters per hour. The polyacetylene precipitates as a deposit. The deposit comprises pink to violet, burr-shaped structures having a diameter of from 0.05 to 0.5 mm. The thus-obtained suspension contains 4 g of polyacetylene per liter. The reaction is stopped using 0.5 g of 4-methyl-2, 6-di-t-butylphenol (Ionol), in 400 ml of absolute toluene and the reaction mixture is purged with nitrogen, the temperature rising to room temperature.

In order to remove the catalyst, the solvent is partly removed by filtration, while new solvent is continuously added. In this manner, toluene may also be replaced by another solvent.

Example 2

Production of a spray suspension 1000 ml of absolute methylene chloride are introduced into a 2 liter stirrer-equipped beaker apparatus. It is cooled to $-78°$ C., and 4.2 ml (12.5 mmol) of titanium tetrabutylate (100%) and 50 ml (50 mmol) of aluminium triisobutyl, 1 molar in methylene chloride, are added.

10 g of acetylene are passed through the catalyst solution over a period of 1 hour at $-78°$ C., with stirring, and dark polyacetylene precipitates. The reaction is stopped using a solution of 0.5 g of 4-methyl-2,6-di-t-butylphenol (Ionol) in 5 ml of methanol and the temperature is allowed to rise to room temperature under a nitrogen stream. Under a microscope, the reaction mixture exhibits dark-violet burr-shaped polyacetylene structures having a diameter of about 0.1 mm. The suspension contains 2.5 g of polyacetylene per liter.

The catalyst is removed analogously to the previous Example.

Example 3

Production of a spray suspension containing doped polyacetylene

A solution of 4 g of iodine in 100 ml of toluene are added with stirring and at room temperature to 1 liter of a polyacetylene suspension produced according to Example 1 and the mixture is subsequently stirred for 2 hours at room temperature. The originally violet solution becomes discoloured and a suspension containing doped burr-shaped polyacetylene particles is obtained.

Examples 4 to 11 describe the production of coatings by spraying a substrate with a polyacetylene suspension.

General method for Examples 4 to 11; The starting point for the coating process is a stable suspension of polyacetylene particles in an organic solvent.

Polyacetylene is abbreviated in the following to PAC.

Example 4

A 20 cm wide, 30 μm thick aluminium film was unwound from a roller in a chamber, under an inert atmosphere, one side of the film being passed by a polyacetylene spray head at a rate of 1 mm per sec at a spacing of 30 cm. During the spray procedure, the spray head was raised and lowered, so that a homogeneous mass coating was provided. The low pressure in the chamber was adjusted such that, after depositing on the substrate surface, the solvent evaporated spontaneously and a PAC film grew on the film surface. The film formation was effectively controllable by adjusting the spray intensity. The connection between the thickness of the polyacetylene layer which was sprayed on and the mass/surface unit was linear. The working conditions were selected such that the polyacetylene layer on the Al film was in a thickness of 200 μm, and the unit weight was 5 mg/cm$^2$.

Example 5

Like Example 4, instead of the Al film, a polycarbonate film of the same dimensions.

Example 6

A polycarbonate film which was metallized on one side with aluminium was coated on the aluminium with polyacetylene as in Example 5.

Example 7

A polycarbonate film coated on both sides with Al was also coated with polyacetylene on both sides as in Example 5.

Example 8

A 30×30 cm epoxy resin plate covered with Cu was coated with PAC as in Example 4.

Example 9

A 1 m long, 30 cm wide and 20 μm thick polyethylene film, on the longitudinal sides of which two contact strips of Al had been deposited was coated with doped polyacetylene (300 μm) as in Example 4, and a 2 cm wide marginal strip was left free. An effectively insulating Teflon ® layer was then sprayed over the complete sheet structure, so that the polyacetylene layer was enclosed all round by the two plastics layers. The PAC layer lying in the laminate had a quadratic surface conductivity of 10 Ohm. When a low voltage of about 40 volts was applied, the laminate could be heated to from 30° to 40° C., and thus could be used as a heating film.

Example 10

A 1 square meter glass plate was coated with PAC as in Example 4.

Example 11

A 1 m long, 30 cm wide and 30 μm thick polyester film was coated with a transparent conductor of indium tin oxide and then coated with polyacetylene as in Example 4.

Examples 12 to 15 describe the production of polyacetylene laminates by applying a polyacetylene suspension onto a substrate film under an inert gas atmosphere by casting, rolling, doctoring, brushing or by a combination of these methods.

Example 12

A 1 m wide and 30 μm thick polycarbonate film is unwound from a roller and is guided along below a storage container containing PAC suspension and having a slit-shaped opening of variable slit width. Polyacetylene suspension was continuously applied onto the substrate film through the slit and was smoothed by a doctor blade downstream. The coated polycarbonate film then passed through a heating furnace with a suction solvent removal. After the drying procedure, the film was guided between two press rollers, and an intensive join was produced between the polycarbonate film and the PAC layer.

Example 13

Like Example 12, instead of the polycarbonate film, a nickel-metallized polycarbonate film.

Example 14

An aluminium film is coated according to the same method as in Example 12.

Example 15

As in Example 12, but the drying procedure is not completed, so that the PAC layer is still moist and contains residual solvent. During the rolling procedure, a cover laminate of Cellidor and polyvinylidene chloride was simultaneously pressed on. The residual solvent started superficially to dissolve the polyethylene layer, so that a firm film join was produced.

Example 16

An undoped polyacetylene film was immersed into a 2% aqueous solution of a polyvinyl alcohol. After draining and drying, a bilaterally coated polyacetylene film is obtained. The thickness of the covering is 5 μm per side.

Example 17

A 100 μm thick undoped polyacetylene film is covered with a polyethylene film in a thickness of 20 μm. Both films are pressed together for 1 minute at 200 bars at 100° C. A laminate having a thickness of 70 μm is obtained.

Example 18

A polyacetylene film was coated on both sides with polyethylene analogously to the previous Example. The laminate is 85 μm thick.

Example 19

Analogously to Example 17, a polyacetylene film was covered on both sides with a compound film of polyester and polyvinylidene chloride, the polyester side being brought into contact with the polyacetylene.

Example 20

An iodine-doped polyacetylene film was covered on both sides with a polyvinylidene chloride film of a thickness of 20 μm. The projecting edges of the polyvinylidene chloride film were welded in an air-tight manner under vacuum.

Example 21

A polycarbonate film is bonded onto a flim of polyacetylene using a contact adhesive based on polychloroprene. A stable join is obtained.

Example 22

A polyacetylene film is sprayed regularly on one side with a solution of 0.1 g of butadiene palladium dichloride per liter of chloroform (blowing agent Frigen).

The film is then dried at room temperature and immersed into analkaline nickel-plating bath containing 30 g/l of nickel chloride, 3 g/l of dimethylaminoborane and 10 g/l of citric acid, and the bath was adjusted with ammonia to pH 8.1. After about 30 seconds, the surface starts to darken and after 10 minutes, a firmly adhesive, metallically lustrous nickel layer had been deposited.

All the working cycles are carried out under an inert gas atmosphere of nitrogen.

Example 23

An undoped polyacetylene film is immersed for 30 seconds into a solution of 0.3 g of dicyclopentadiene-gold (I)- chloride in 1 liter of chloroform, dried at room temperature and then nickel plated for 20 minutes in an alkaline nickel-plating bath according to Example 22.

A film is obtained which is coated on both sides with a firmly adhering nickel layer, being 4 μm thick on each side.

All the operations are carried out under a nitrogen atmosphere.

We claim:

1. A laminate comprising a doped polyacetylene film joined to a film-forming, plastic polyolefin layer.

2. A laminate according to claim 1 wherein the plastic layer is impermeable to oxygen.

3. A laminate comprising a polyacetylene film having two faces, where each face is joined to a plastic, film-forming polyolefin layer and where the edges of the laminate are sealed with the plastic.

4. A laminate according to claim 3 wherein the polyacetylene is doped polyacetylene.

5. A laminate according to claim 3 wherein the plastic layers and edges are impermeable to oxygen.

6. A laminate in accordance with claim 4 wherein the plastic layers and edges are impermeable to oxygen.

7. A laminate in accordance with claim 1 wherein one plastic layer lies between two polyacetylene films.

8. A laminate comprising a doped polyacetylene film joined to a film-forming, plastic layer where the plastic is selected from a halogenated polyethylene, a polyvinyl acetate, a polyvinyl alcohol, a polyacetal, a polystyrene, a polyester, a polycarbonate, a polysulfone, a polyurethane, or a polyamide.

9. A laminate according to claim 8 wherein the plastic layer is impermeable to oxygen.

10. A laminate comprising a polyacetylene film having two faces, where each face is joined to a film-forming, plastic layer and where the edges of the laminate are sealed with the plastic, where the plastic is selected from a halogenated polyethylene, a polyvinyl acetate, polyvinyl alcohol, a polyacetal, a polystyrene, a polyester, a polycarbonate, a polysulfone, a polyurethane, or a polyamide.

11. A laminate according to claim 10 wherein the polyacetylene is doped polyacetylene.

12. A laminate according to claim 10 wherein the plastic layers and edges are impermeable to oxygen.

13. A laminate in accordance with claim 11 wherein the plastic layers and edges are impermeable to oxygen.

14. A laminate in accordance with claim 8 wherein one plastic layer lies between two polyacetylene films.

15. A laminate comprising an oxygen impermeable, plastic polyolefin film having two-faces, where each face is joined to a polyacetylene film.

16. A laminate comprising a plastic film having two faces, where each face is joined to a polyacetylene film and where the plastic is selected from a halogenated polyethylene, a polyvinyl acetate, a polyvinyl alcohol, a polyacetal, a polystyrene, a polyester, a polycarbonate, a polysulfone, a polyurethane, or a polyamide.

* * * * *